(12) United States Patent
Tanaka

(10) Patent No.: US 11,942,998 B2
(45) Date of Patent: Mar. 26, 2024

(54) OPTICAL RECEPTION DEVICE, STATION-SIDE DEVICE, PON SYSTEM, PREAMPLIFIER, OPTICAL RECEPTION METHOD, AND METHOD FOR SUPPRESSING OUTPUT INVERSION OF INTEGRATOR

(71) Applicant: SUMITOMO ELECTRIC INDUSTRIES, LTD., Osaka (JP)

(72) Inventor: Naruto Tanaka, Osaka (JP)

(73) Assignee: SUMITOMO ELECTRIC INDUSTRIES, LTD., Osaka (JP)

( * ) Notice: Subject to any disclaimer, the term of this patent is extended or adjusted under 35 U.S.C. 154(b) by 336 days.

(21) Appl. No.: 17/607,297

(22) PCT Filed: Jun. 8, 2020

(86) PCT No.: PCT/JP2020/022495
§ 371 (c)(1),
(2) Date: Oct. 28, 2021

(87) PCT Pub. No.: WO2020/250846
PCT Pub. Date: Dec. 17, 2020

(65) Prior Publication Data
US 2022/0190932 A1    Jun. 16, 2022

(30) Foreign Application Priority Data

Jun. 13, 2019 (JP) .................................. 2019-110446

(51) Int. Cl.
*H04B 10/69* (2013.01)
*H03F 3/08* (2006.01)
*H04B 10/272* (2013.01)

(52) U.S. Cl.
CPC ............... *H04B 10/69* (2013.01); *H03F 3/08* (2013.01); *H04B 10/693* (2013.01); *H04B 10/272* (2013.01)

(58) Field of Classification Search
CPC ............................................ H04B 10/69–6973
See application file for complete search history.

(56) References Cited

U.S. PATENT DOCUMENTS 11,060,906 B1 * 7/2021 Wang .................. H03F 3/45475
2002/0101270 A1 * 8/2002 Nishizono .......... H04B 10/6931
327/205

(Continued)

FOREIGN PATENT DOCUMENTS

JP    H08-125619 A    5/1996
JP    2000-232418 A   8/2000

(Continued)

*Primary Examiner* — Nathan M Cors
(74) *Attorney, Agent, or Firm* — Faegre Drinker Biddle & Reath LLP

(57) ABSTRACT

An optical reception device includes: a light receiving element; an amplifier which receives and amplifies a current based on an input current from the light receiving element; a direct-current adjustment circuit which removes an offset current included in the input current; an alternating-current adjustment circuit which causes a part of the input current to flow therein; and a controller which controls the direct-current adjustment circuit and the alternating-current adjustment circuit. The controller includes an integrator configured to integrate an output of the amplifier and output a resultant output to two electric paths of a positive phase and a negative phase, and an inversion suppression circuit configured to operate so as to inject a current to the positive phase and extract a current from the negative phase when a negative phase potential of an output of the integrator is higher than a positive phase potential thereof.

21 Claims, 8 Drawing Sheets

(56) References Cited

U.S. PATENT DOCUMENTS

| | | |
|---|---|---|
| 2007/0286611 A1 | 12/2007 | Weber et al. |
| 2015/0207469 A1 | 7/2015 | Mita et al. |
| 2015/0270808 A1 | 9/2015 | Sugimoto |
| 2016/0142026 A1* | 5/2016 | Kim ........................ H03F 1/223 |
| | | 330/291 |
| 2017/0294970 A1 | 10/2017 | Mita |
| 2020/0014463 A1* | 1/2020 | Tanaka .................. H03F 1/3211 |

FOREIGN PATENT DOCUMENTS

| | | |
|---|---|---|
| JP | 2010-178256 A | 8/2010 |
| JP | 2010-199697 A | 9/2010 |
| JP | 2011-250137 A | 12/2011 |
| JP | 2012-060436 A | 3/2012 |
| JP | 2015-186013 A | 10/2015 |
| WO | WO-2014/112051 A1 | 7/2014 |
| WO | WO-2016/035374 A1 | 3/2016 |

* cited by examiner

… (1)

OPTICAL RECEPTION DEVICE, STATION-SIDE DEVICE, PON SYSTEM, PREAMPLIFIER, OPTICAL RECEPTION METHOD, AND METHOD FOR SUPPRESSING OUTPUT INVERSION OF INTEGRATOR

TECHNICAL FIELD

The present disclosure relates to an optical reception device, an optical line terminal, a PON system, a preamplifier, an optical reception method, and a method for suppressing inversion of an output of an integrator.

This application claims priority on Japanese Patent Application No. 2019-110446 filed on Jun. 13, 2019, the entire content of which is incorporated herein by reference.

BACKGROUND ART

In an optical reception device used in optical reception, an optical signal in a burst state received by a photodiode is outputted in a form of a differential signal via a preamplifier (TIA: Transimpedance Amplifier) (e.g., see PATENT LITERATURE 1). An optical line terminal of a PON (Passive Optical Network) system is connected to a large number of optical network units via optical fibers. Therefore, the distances from the optical network units to the optical line terminal are not uniform, and the respective optical network units have large differences in the strengths of optical signals reaching an optical reception device installed in the optical line terminal.

Therefore, an adjustment circuit for releasing (or extracting) a part of a current obtained through conversion by a photodiode is provided, and when the strength of the optical signal is high, a part of the current is released, and when the strength of the optical signal is weak, the releasing function is stopped (e.g., see PATENT LITERATURE 2, 3). The stopping is considered to be realized by providing a negative offset voltage to a reference voltage so as to produce a voltage lower than the output of an amplification stage. When a part of the current is released, a closed-loop control is performed, and when the releasing function is stopped, an open-loop control is performed.

CITATION LIST

Patent Literature

PATENT LITERATURE 1: Japanese Laid-Open Patent Publication No. 2011-250137
PATENT LITERATURE 2: Japanese Laid-Open Patent Publication No. 2012-60436
PATENT LITERATURE 3: International Publication No. WO2016/035374 A1

SUMMARY OF INVENTION

The present disclosure includes the following invention. However, the present invention is defined by the claims.

Optical Reception Device

The present disclosure is an optical reception device configured to receive an optical signal in a burst state. The optical reception device includes:
a light receiving element configured to receive the optical signal;
an amplifier configured to receive and amplify a current based on an input current from the light receiving element;
a direct-current adjustment circuit connected to an input electric path extending from the light receiving element to the amplifier, the direct-current adjustment circuit being configured to remove an offset current included in the input current;
an alternating-current adjustment circuit connected to the input electric path and configured to cause a part of the input current to flow therein; and
a controller configured to control the direct-current adjustment circuit and the alternating-current adjustment circuit on the basis of an output of the amplifier and a reference voltage.
The controller includes:
an integrator configured to integrate the output of the amplifier and output a resultant output to two electric paths of a positive phase and a negative phase; and
an inversion suppression circuit configured to operate so as to inject a current to the positive phase and extract a current from the negative phase when a negative phase potential of the output of the integrator is higher than a positive phase potential thereof.

Optical Line Terminal

The present disclosure is an optical line terminal connected to a plurality of optical network units via an optical transmission line formed by an optical fiber. The optical line terminal includes:
a light receiving element configured to receive an optical signal in a burst state from each optical network unit;
an amplifier configured to receive and amplify a current based on an input current from the light receiving element;
a direct-current adjustment circuit connected to an input electric path extending from the light receiving element to the amplifier, the direct-current adjustment circuit being configured to remove an offset current included in the input current;
an alternating-current adjustment circuit connected to the input electric path and configured to cause a part of the input current to flow therein; and
a controller configured to control the direct-current adjustment circuit and the alternating-current adjustment circuit on the basis of an output of the amplifier and a reference voltage.
The controller includes:
an integrator configured to integrate the output of the amplifier and output a resultant output to two electric paths of a positive phase and a negative phase; and
an inversion suppression circuit configured to operate so as to inject a current to the positive phase and extract a current from the negative phase when a negative phase potential of the output of the integrator is higher than a positive phase potential thereof.

PON System

A PON system of the present disclosure includes:
a plurality of optical network units;
an optical transmission line formed by an optical fiber; and
an optical line terminal configured to communicate with the plurality of optical network units via the optical transmission line.

An optical reception device installed at least to the optical line terminal among the optical network units and the optical line terminal includes:
  a light receiving element configured to receive an optical signal in a burst state from each optical network unit;
  an amplifier configured to receive and amplify a current based on an input current from the light receiving element;
  a direct-current adjustment circuit connected to an input electric path extending from the light receiving element to the amplifier, the direct-current adjustment circuit being configured to remove an offset current included in the input current;
  an alternating-current adjustment circuit connected to the input electric path and configured to cause a part of the input current to flow therein; and
  a controller configured to control the direct-current adjustment circuit and the alternating-current adjustment circuit on the basis of an output of the amplifier and a reference voltage.

The controller includes:
  an integrator configured to integrate the output of the amplifier and output a resultant output to two electric paths of a positive phase and a negative phase; and
  an inversion suppression circuit configured to operate so as to inject a current to the positive phase and extract a current from the negative phase when a negative phase potential of the output of the integrator is higher than a positive phase potential thereof.

Preamplifier

A preamplifier of the present disclosure includes:
  an amplifier configured to receive and amplify a current based on an input current from a light receiving element configured to receive an optical signal in a burst state;
  a direct-current adjustment circuit connected to an input electric path extending from the light receiving element to the amplifier, the direct-current adjustment circuit being configured to remove an offset current included in the input current;
  an alternating-current adjustment circuit connected to the input electric path and configured to cause a part of the input current to flow therein; and
  a controller configured to control the direct-current adjustment circuit and the alternating-current adjustment circuit on the basis of an output of the amplifier and a reference voltage.

The controller includes:
  an integrator configured to integrate the output of the amplifier and output a resultant output to two electric paths of a positive phase and a negative phase; and
  an inversion suppression circuit configured to operate so as to inject a current to the positive phase and extract a current from the negative phase when a negative phase potential of the output of the integrator is higher than a positive phase potential thereof.

Optical Reception Method

The present disclosure is an optical reception method for receiving an optical signal in a burst state. The optical reception method includes, in a stage of preamplification:
  receiving and amplifying, by an amplifier, a current based on an input current from a light receiving element configured to receive the optical signal;
  removing an offset current included in the input current and releasing a part of the input current, on the basis of an output of the amplifier and a reference voltage; and
  integrating, by an integrator, the output of the amplifier and outputting a resultant output to two electric paths of a positive phase and a negative phase, and when a negative phase potential of the output to the two electric paths is higher than a positive phase potential thereof, injecting a current to the positive phase and extracting a current from the negative phase.

Method for Suppressing Inversion of Output of Integrator

The present disclosure is a method for suppressing inversion of an output of an integrator in a preamplifier for optical reception. The method includes:
  receiving and amplifying a current based on an input current from a light receiving element configured to receive an optical signal in a burst state;
  removing an offset current included in the input current and releasing a part of the input current, on the basis of an output obtained through amplification and a reference voltage; and
  integrating, by the integrator, the output and outputting a resultant output to two electric paths of a positive phase and a negative phase, and when a negative phase potential of the output to the two electric paths is higher than a positive phase potential thereof, injecting a current to the positive phase and extracting a current from the negative phase.

DESCRIPTION OF EMBODIMENTS

Figure 1:
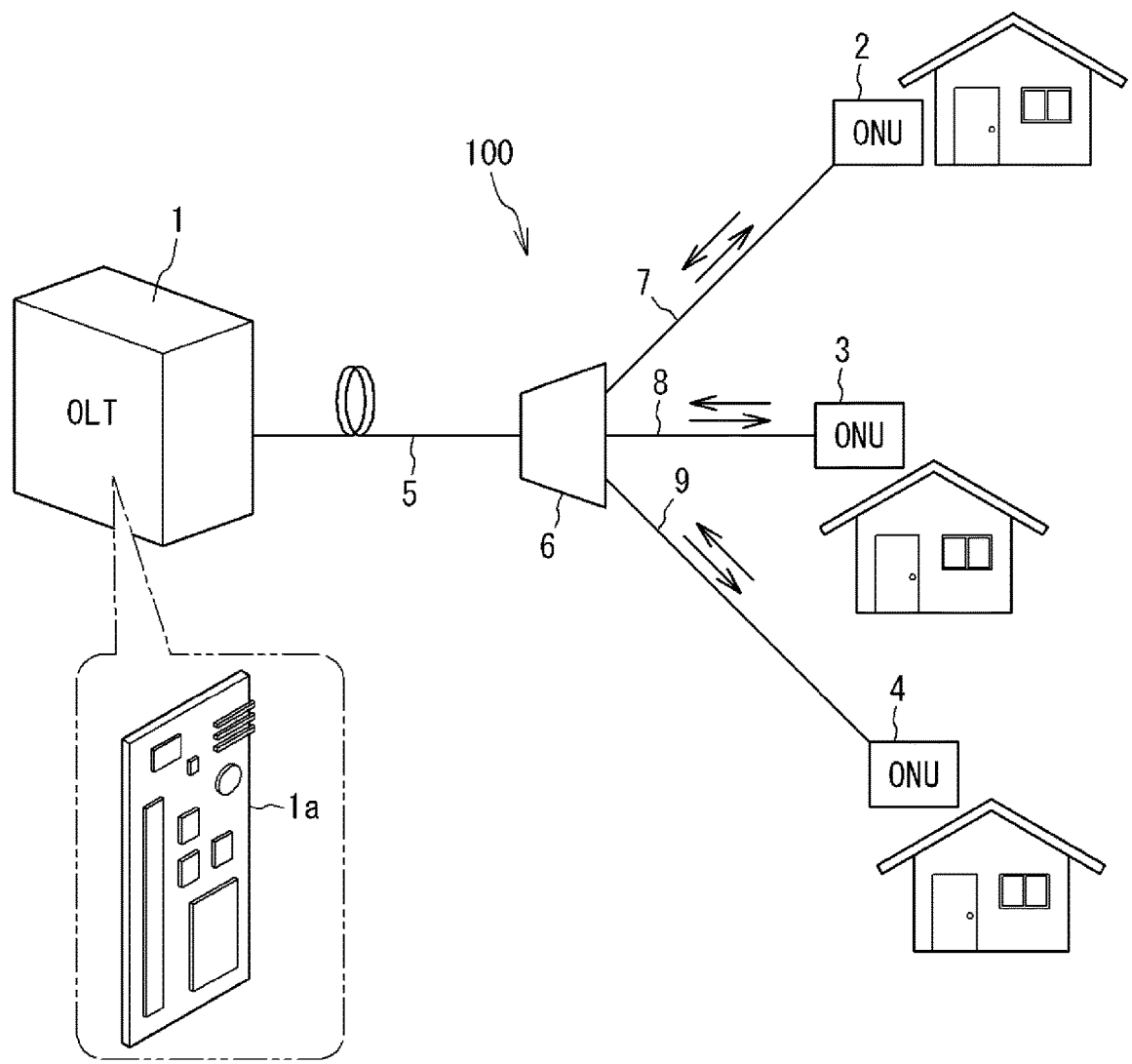
FIG. 1 is a connection diagram of a PON system according to an embodiment.

Problems to be Solved by the Present Disclosure

When a negative offset voltage provided to a reference voltage is large, outputs in a positive phase and a negative phase of an integrator may be inverted, thereby causing increase in potential difference. In such a case, transient response to a burst may be delayed, resulting in a failure of normal reception of the optical signal.

In consideration of this problem, an object of the present disclosure is to suppress inversion of an output of an integrator in an optical reception device that receives an optical signal in a burst state.

Effects of the Present Disclosure

According to the present disclosure, inversion of an output of an integrator in an optical reception device that receives an optical signal in a burst state can be suppressed.

Description of Embodiment of the Present Disclosure

An embodiment of the present disclosure includes at least the following as a gist.

(1) Disclosed as an optical reception device is an optical reception device configured to receive an optical signal in a burst state. The optical reception device includes: a light receiving element configured to receive the optical signal; an amplifier configured to receive and amplify a current based on an input current from the light receiving element; a direct-current adjustment circuit connected to an input electric path extending from the light receiving element to the amplifier, the direct-current adjustment circuit being configured to remove an offset current included in the input current; an alternating-current adjustment circuit connected to the input electric path and configured to cause a part of the input current to flow therein; and a controller configured to control the direct-current adjustment circuit and the alternating-current adjustment circuit on the basis of an output of the amplifier and a reference voltage. The controller includes: an integrator configured to integrate the output of the amplifier and output a resultant output to two electric paths of a positive phase and a negative phase; and an inversion suppression circuit configured to operate so as to inject a current to the positive phase and extract a current from the negative phase when a negative phase potential of the output of the integrator is higher than a positive phase potential thereof.

In this optical reception device, when the output of the integrator is inverted and a state where the negative phase potential is higher than the positive phase potential is established, the inversion suppression circuit can operate so as to inject a current to the positive phase and extract a current from the negative phase. Accordingly, inversion of the output of the integrator is suppressed. Therefore, even when a sufficient negative offset voltage is provided, the potential difference in the output of the integrator can be suppressed from being inverted and increased. Thus, inversion of the output of the integrator in an optical reception device that receives an optical signal in a burst state can be suppressed.

(2) Preferably, in the optical reception device of (1) above, the current injected by the inversion suppression circuit and the current extracted by the inversion suppression circuit are equivalent to each other.

In this case, since the current that is injected and the current that is extracted are equivalent to each other, the common potential of the output of the integrator is not varied.

(3) In the optical reception device of (1) or (2) above, the inversion suppression circuit may include: an operational transconductance amplifier configured to convert, into a current, a voltage outputted by the integrator and based on a potential difference between the positive phase and the negative phase, the operational transconductance amplifier being configured to output the current; and a current mirror circuit configured to generate a current to be injected to the positive phase and a current to be extracted from the negative phase, on the basis of an output of the operational transconductance amplifier.

In this case, when the positive phase potential of the output of the integrator is higher than the negative phase potential thereof, the inversion suppression circuit neither applies a current nor extracts a current. Upon occurrence of a state where the negative phase potential of the output of the integrator is higher than the positive phase potential thereof, i.e., upon occurrence of inversion of the potentials, currents that suppress the inversion can be immediately generated by the current mirror circuit.

(4) In the optical reception device of any one of (1) to (3) above, a negative offset voltage is added to the reference voltage, for example.

In a case where there is a difference in the strength of an optical signal in a burst state, and, for example, the strength is relatively weak, if a negative offset voltage is not provided to the reference voltage, increase of noise may be caused by the direct-current adjustment circuit extracting a current in a condition where a positive offset voltage increases even in a small degree. Therefore, reducing the negative offset voltage is not a good measure, and a sufficient negative offset voltage is preferably provided.

(5) In the optical reception device of any one of (1) to (4) above, when, for example, the positive phase potential is higher than the negative phase potential, the inversion suppression circuit does not perform an operation of injecting a current to the positive phase and extracting a current from the negative phase.

When the positive phase potential is higher than the negative phase potential, the inversion suppression circuit does not perform wasteful operations.

(6) As an optical line terminal, an optical line terminal connected to a plurality of optical network units via an optical transmission line formed by an optical fiber is provided. The optical line terminal includes: a light receiving element configured to receive an optical signal in a burst state from each optical network unit; an amplifier configured to receive and amplify a current based on an input current from the light receiving element; a direct-current adjustment circuit connected to an input electric path extending from the light receiving element to the amplifier, the direct-current adjustment circuit being configured to remove an offset current included in the input current; an alternating-current adjustment circuit connected to the input electric path and configured to cause a part of the input current to flow therein; and a controller configured to control the direct-current adjustment circuit and the alternating-current adjustment circuit on the basis of an output of the amplifier and a reference voltage. The controller includes: an integrator configured to integrate the output of the amplifier and output a resultant output to two electric paths of a positive phase and a negative phase; and an inversion suppression circuit configured to operate so as to inject a current to the positive phase and extract a current from the negative phase when a negative phase potential of the output of the integrator is higher than a positive phase potential thereof.

In this optical line terminal, when the output of the integrator is inverted and a state where the negative phase potential is higher than the positive phase potential is established, the inversion suppression circuit can operate so as to inject a current to the positive phase and extract a current from the negative phase. Accordingly, inversion of the output of the integrator is suppressed. Therefore, even when a sufficient negative offset voltage is provided, the potential difference in the output of the integrator can be suppressed from being inverted and increased. Thus, inversion of the output of the integrator in an optical line terminal that receives an optical signal in a burst state can be suppressed.

(7) As a PON system, provided is a PON system including: a plurality of optical network units; an optical transmission line formed by an optical fiber; and an optical line terminal configured to communicate with the plurality of optical network units via the optical transmission line. An optical reception device installed at least to the optical line terminal among the optical network units and the optical line terminal includes: a light receiving element configured to receive an optical signal in a burst state from each optical network unit; an amplifier configured to receive and amplify a current based on an input current from the light receiving element; a direct-current adjustment circuit connected to an input electric path extending from the light receiving element to the amplifier, the direct-current adjustment circuit being configured to remove an offset current included in the input current; an alternating-current adjustment circuit connected to the input electric path and configured to cause a part of the input current to flow therein; and a controller configured to control the direct-current adjustment circuit and the alternating-current adjustment circuit on the basis of an output of the amplifier and a reference voltage. The controller includes: an integrator configured to integrate the output of the amplifier and output a resultant output to two electric paths of a positive phase and a negative phase; and an inversion suppression circuit configured to operate so as to inject a current to the positive phase and extract a current from the negative phase when a negative phase potential of the output of the integrator is higher than a positive phase potential thereof.

In this PON system, in an optical reception device in an optical line terminal, when the output of the integrator is inverted and a state where the negative phase potential is higher than the positive phase potential is established, the inversion suppression circuit can operate so as to inject a current to the positive phase and extract a current from the negative phase. Accordingly, inversion of the output of the integrator is suppressed. Therefore, even when a sufficient negative offset voltage is provided, the potential difference in the output of the integrator can be suppressed from being inverted and increased. Thus, inversion of the output of the integrator in an optical reception device that receives an optical signal in a burst state can be suppressed.

(8) As a preamplifier, provided is a preamplifier including: an amplifier configured to receive and amplify a current based on an input current from a light receiving element configured to receive an optical signal in a burst state; a direct-current adjustment circuit connected to an input electric path extending from the light receiving element to the amplifier, the direct-current adjustment circuit being configured to remove an offset current included in the input current; an alternating-current adjustment circuit connected to the input electric path and configured to cause a part of the input current to flow therein; and a controller configured to control the direct-current adjustment circuit and the alternating-current adjustment circuit on the basis of an output of the amplifier and a reference voltage. The controller includes: an integrator configured to integrate the output of the amplifier and output a resultant output to two electric paths of a positive phase and a negative phase; and an inversion suppression circuit configured to operate so as to inject a current to the positive phase and extract a current from the negative phase when a negative phase potential of the output of the integrator is higher than a positive phase potential thereof.

In this preamplifier, when the output of the integrator is inverted and a state where the negative phase potential is higher than the positive phase potential is established, the inversion suppression circuit can operate so as to inject a current to the positive phase and extract a current from the negative phase. Accordingly, inversion of the output of the integrator is suppressed. Therefore, even when a sufficient negative offset voltage is provided, the potential difference in the output of the integrator can be suppressed from being inverted and increased. Thus, inversion of the output of the integrator when an optical signal in a burst state is received can be suppressed.

(9) As an optical reception method, an optical reception method for receiving an optical signal in a burst state is provided. The optical reception method includes, in a stage of preamplification: receiving and amplifying, by an amplifier, a current based on an input current from a light receiving element configured to receive the optical signal; removing an offset current included in the input current and releasing a part of the input current, on the basis of an output of the amplifier and a reference voltage; and integrating, by an integrator, the output of the amplifier and outputting a resultant output to two electric paths of a positive phase and a negative phase, and when a negative phase potential of the output to the two electric paths is higher than a positive phase potential thereof, injecting a current to the positive phase and extracting a current from the negative phase.

According to this optical reception method, when the output of the integrator is inverted and a state where the negative phase potential is higher than the positive phase potential is established, it is possible to inject a current to the positive phase and extract a current from the negative phase. Accordingly, inversion of the output of the integrator is suppressed. Therefore, even when a sufficient negative offset voltage is provided, the potential difference in the output of the integrator can be suppressed from being inverted and increased. Thus, inversion of the output of the integrator when an optical signal in a burst state is received can be suppressed.

(10) As a method for suppressing inversion of an output of an integrator, a method for suppressing inversion of an output of an integrator in a preamplifier for optical reception is provided. The method includes: receiving and amplifying a current based on an input current from a light receiving element configured to receive an optical signal in a burst state; removing an offset current included in the input current and releasing a part of the input current, on the basis of an output obtained through amplification and a reference voltage; and integrating, by the integrator, the output and outputting a resultant output to two electric paths of a positive phase and a negative phase, and when a negative phase potential of the output to the two electric paths is higher than a positive phase potential thereof, injecting a current to the positive phase and extracting a current from the negative phase.

According to this method for suppressing inversion of the output, when the output of the integrator is inverted and a state where the negative phase potential is higher than the positive phase potential is established, it is possible to inject a current to the positive phase and extract a current from the negative phase. Accordingly, inversion of the output of the integrator is suppressed. Therefore, even when a sufficient negative offset voltage is provided, the potential difference in the output of the integrator can be suppressed from being inverted and increased. Thus, inversion of the output of the integrator when an optical signal in a burst state is received can be suppressed.

Details of Embodiment of the Present Disclosure

Hereinafter, a specific example of the present disclosure will be described with reference to the drawings.

PON System

FIG. 1 is a connection diagram of a PON system 100 according to an embodiment. In FIG. 1, an optical line terminal (OLT) 1 is installed as an aggregation station for a plurality of optical network units (ONU) 2, 3, 4 connected in a P2MP (Point to Multipoint) relationship. The optical network units 2, 3, 4 are each installed in a house of a subscriber of the PON system 100. In this system, an optical fiber network in which a single optical fiber (trunk line) 5 connected to the optical line terminal 1 is branched via an optical coupler 6 into a plurality of optical fibers (branch lines) 7, 8, 9 is formed. The number of optical network units is merely an example for facilitating drawing, and is much greater in actuality.

Between the optical line terminal 1 and each optical network unit 2, 3, 4, uplink communication from the optical network unit 2, 3, 4 to the optical line terminal 1, and downlink communication from the optical line terminal 1 to each optical network unit 2, 3, 4 are possible. The distances from the optical coupler 6 to the respective optical network units 2, 3, 4 are not uniform, and there are differences in the distance. Therefore, there are differences in the strengths of optical signals that reach the optical line terminal 1 from the optical network units 2, 3, 4. A line card 1a including an optical reception device is installed in the optical line terminal 1.

Optical Reception Device

Figure 2:
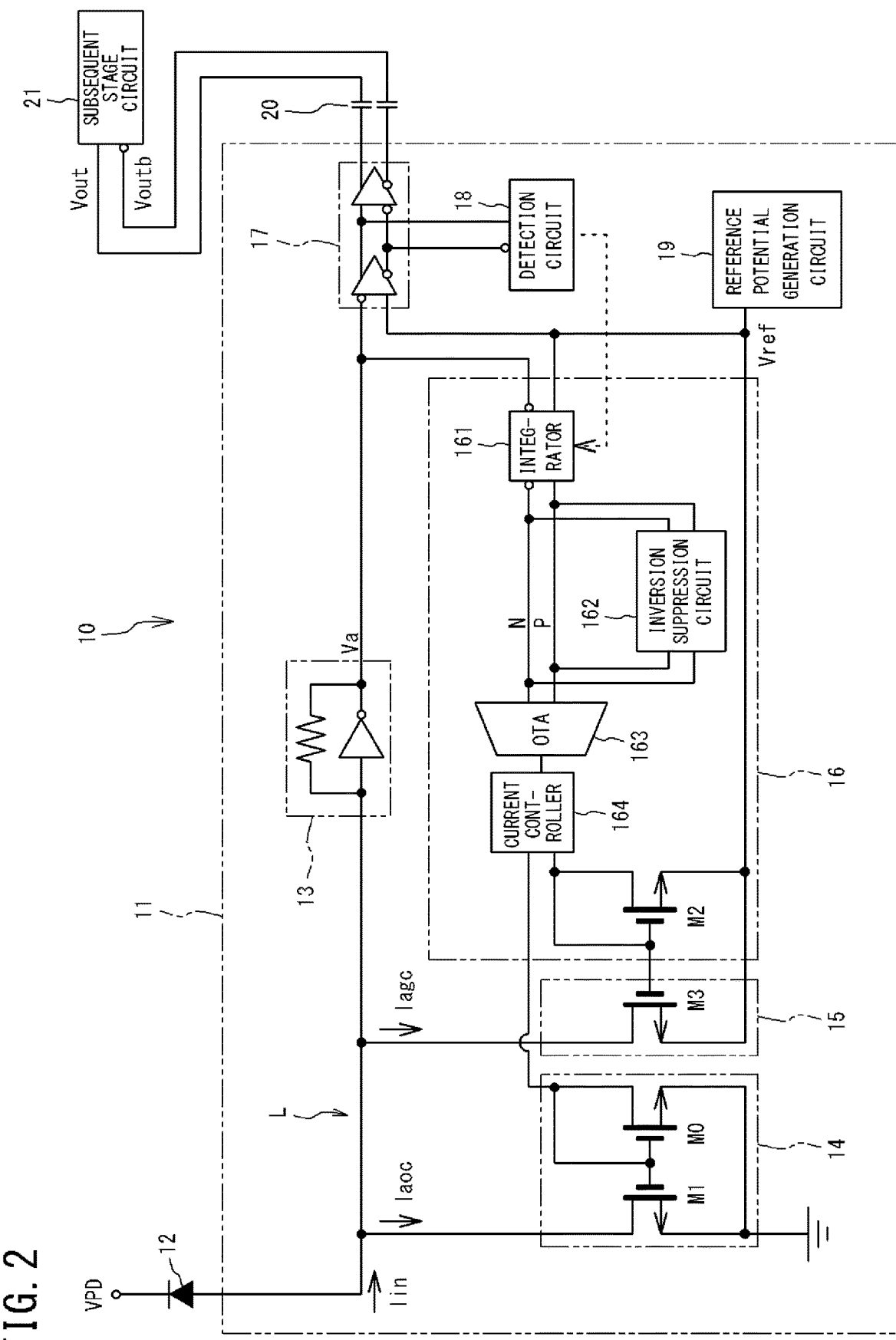
FIG. 2 shows an example of a circuit configuration of an optical reception device, and is a diagram particularly focused on the part of a preamplifier.

FIG. 2 shows an example of a circuit configuration of an optical reception device 10, and is a diagram particularly focused on the part of a preamplifier 11. The optical reception device 10 is a device that receives an optical signal in a burst state (hereinafter, simply referred to as a "burst") sent from the optical network unit 2, 3, 4. The optical reception device 10 includes: an avalanche photodiode 12 as a light receiving element; an amplifier 13; a direct-current adjustment circuit 14; an alternating-current adjustment circuit 15; a controller 16; a differential circuit 17; a detection circuit 18; and a reference potential generation circuit 19. The output (Vout, Voutb) of the preamplifier 11 is sent, via an AC coupling by a capacitor 20, to a subsequent stage circuit 21.

The avalanche photodiode 12 having a voltage VPD applied to a cathode thereof converts an optical signal into a current. The amplifier 13 receives and amplifies the current based on an input current from the avalanche photodiode 12, and outputs a voltage Va. The direct-current adjustment circuit 14 connected to an input electric path L extending from the avalanche photodiode 12 to the amplifier 13 includes current mirror circuits of MOSFETs (Metal-Oxide-Semiconductor-Field-Effect-Transistor, hereinafter, referred to as "MOS transistor") M0, M1.

The direct-current adjustment circuit 14 removes an offset current Iaoc from an input current Iin from the avalanche photodiode 12. Similarly, the alternating-current adjustment circuit 15 connected to the input electric path L includes a MOS transistor M3. The alternating-current adjustment circuit 15 has a function of causing a part (current Iagc) of the current Iin from the avalanche photodiode 12 to flow (to be released) so as not to be sent to the amplifier 13. In this manner, the current Iin is divided into the current Iaoc, the current Iagc, and an input current to the amplifier 13.

The controller 16 includes an integrator 161, an inversion suppression circuit 162, an operational transconductance amplifier (hereinafter, referred to as OTA) 163, a current controller 164, and a MOS transistor M2. The integrator 161, the differential circuit 17, and the MOS transistors M2, M3 are provided with a reference voltage including a negative offset voltage from the reference potential generation circuit 19. Due to the negative offset voltage, the alternating-current adjustment circuit 15 and the direct-current adjustment circuit 14 can be caused to operate with respect to a strong input burst, and the alternating-current adjustment circuit 15 and the direct-current adjustment circuit 14 can be caused not to operate with respect to a weak input burst.

The integrator 161 integrates the output of the amplifier 13, and outputs the resultant output to two electric paths of a positive phase P and a negative phase N. The output of the integrator 161 is provided via the OTA 163 to the current controller 164. The OTA 163 includes a circuit that varies the amplification factor in accordance with an input. The current controller 164 sets an input current range for amplification ratio adjustment. The detection circuit 18 has a function of detecting an output from the differential circuit 17 and switching a time constant of the integrator 161 so as to cope with a strong input burst. The current controller 164 controls the current mirror circuit of the MOS transistors M2, M3, and the current mirror circuit of the MOS transistors M0, M1.

Figure 3:
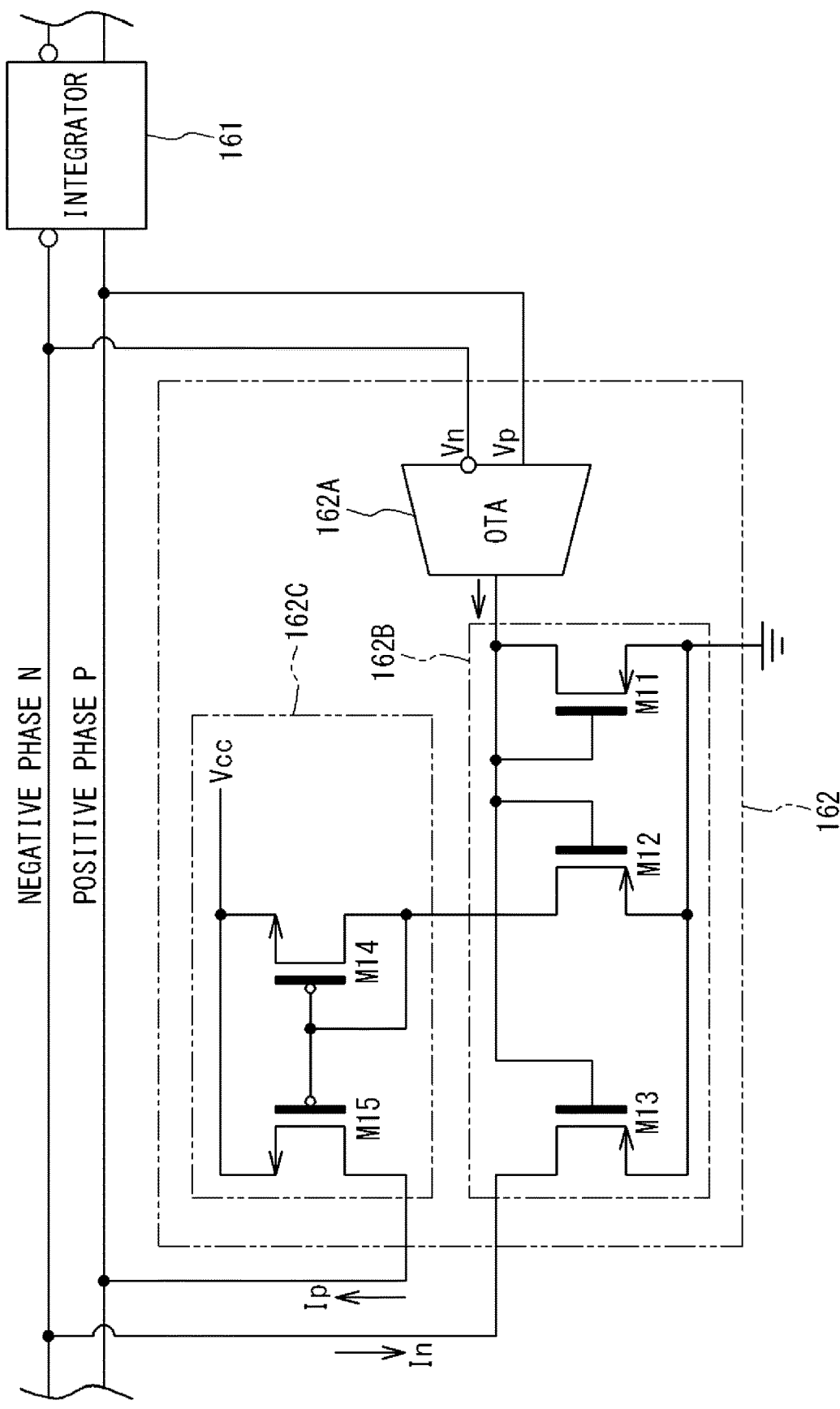
FIG. 3 shows an internal circuit of an inversion suppression circuit shown in FIG. 2.

FIG. 3 shows an internal circuit of the inversion suppression circuit 162 shown in FIG. 2. In FIG. 3, the inversion suppression circuit 162 includes: an OTA 162A; PNP-type MOS transistors M11, M12, M13 forming a current mirror circuit 162B; and NPN-type MOS transistors M14, M15 forming another current mirror circuit 162C. A control power supply voltage Vcc is supplied to the source side of the MOS transistors M14, M15. The source side of the MOS transistors M11, M12, M13 is connected to GND.

The OTA 162A operates on the basis of a positive phase potential Vp and a negative phase potential Vn inputted from the integrator 161. Specifically, when Vp≥Vn, the OTA 162A does not operate. When an inversion state in which the negative phase potential Vn is higher than the positive phase potential Vp is established, and the inverted potential difference exceeds a predetermined reference value, the OTA 162A operates. The operation means to generate a positive output current that is proportional to a potential difference obtained by subtracting the reference value from the inverted potential difference. On the basis of the generated current, a current Ip is injected to the positive phase P and a current In is extracted from the negative phase N, by the current mirror circuit 162B composed of the MOS transistors M11, M12, M13, and the current mirror circuit 162C composed of the MOS transistors M14, M15.

The optical reception device 10 having such an inversion suppression circuit 162 operates such that, when the output of the integrator 161 is inverted and a state where the negative phase potential Vn is higher than the positive phase potential Vp (strictly speaking, a state where the negative phase potential Vn has a high value exceeding a reference value) is established, the inversion suppression circuit 162 applies a current to the positive phase P and extracts a current from the negative phase N. Accordingly, inversion of the output of the integrator 161 is suppressed. Therefore, even when a sufficient negative offset voltage is provided to a reference voltage generated by the reference potential generation circuit 19, the potential difference in the output of the integrator 161 can be suppressed from being inverted and increased.

Due to the operation of the current mirror circuit 162B composed of the MOS transistors M11, M12, M13, the same current In flows in the MOS transistors M11, M12, M13. As a result, a current Ip equivalent to the current In flows also in the MOS transistor M14, and due to the operation of the current mirror circuit 162C composed of the MOS transistors M14, M15, the current Ip flows in the MOS transistor M15. That is, the current Ip injected to the positive phase P and the current In extracted from the negative phase N by the inversion suppression circuit 162 are equivalent to each other. Since the current that is injected and the current that is extracted are equivalent to each other, the common potential of the output of the integrator 161 is not varied.

The OTA 162A of the inversion suppression circuit 162 converts, into a current, the voltage outputted by the integrator 161 and based on the potential difference between the positive phase and the negative phase, and outputs the current. On the basis of the output of the OTA 162A, the current mirror circuits 162B, 162C generate a current to be injected to the positive phase and a current to be extracted from the negative phase. In this case, when the positive phase potential Vp of the output of the integrator 161 is higher than the negative phase potential Vn, the inversion suppression circuit 162 neither applies nor extracts a current. In other words, the inversion suppression circuit 162 does not perform wasteful operations. Upon occurrence of a state where the negative phase potential Vn of the output of the integrator 161 is higher than the positive phase potential Vp, i.e., upon occurrence of inversion of the potentials, currents that suppress the inversion can be immediately generated by the current mirror circuits 162B, 162C.

In the following, effects of the inversion suppression circuit 162 are described with reference to graphs. First, for comparison, a case where the inversion suppression circuit 162 is not provided is described.

Case Where Inversion Suppression Circuit is not Provided

Integrator Output Inversion in Open Loop Operation

Figure 4:
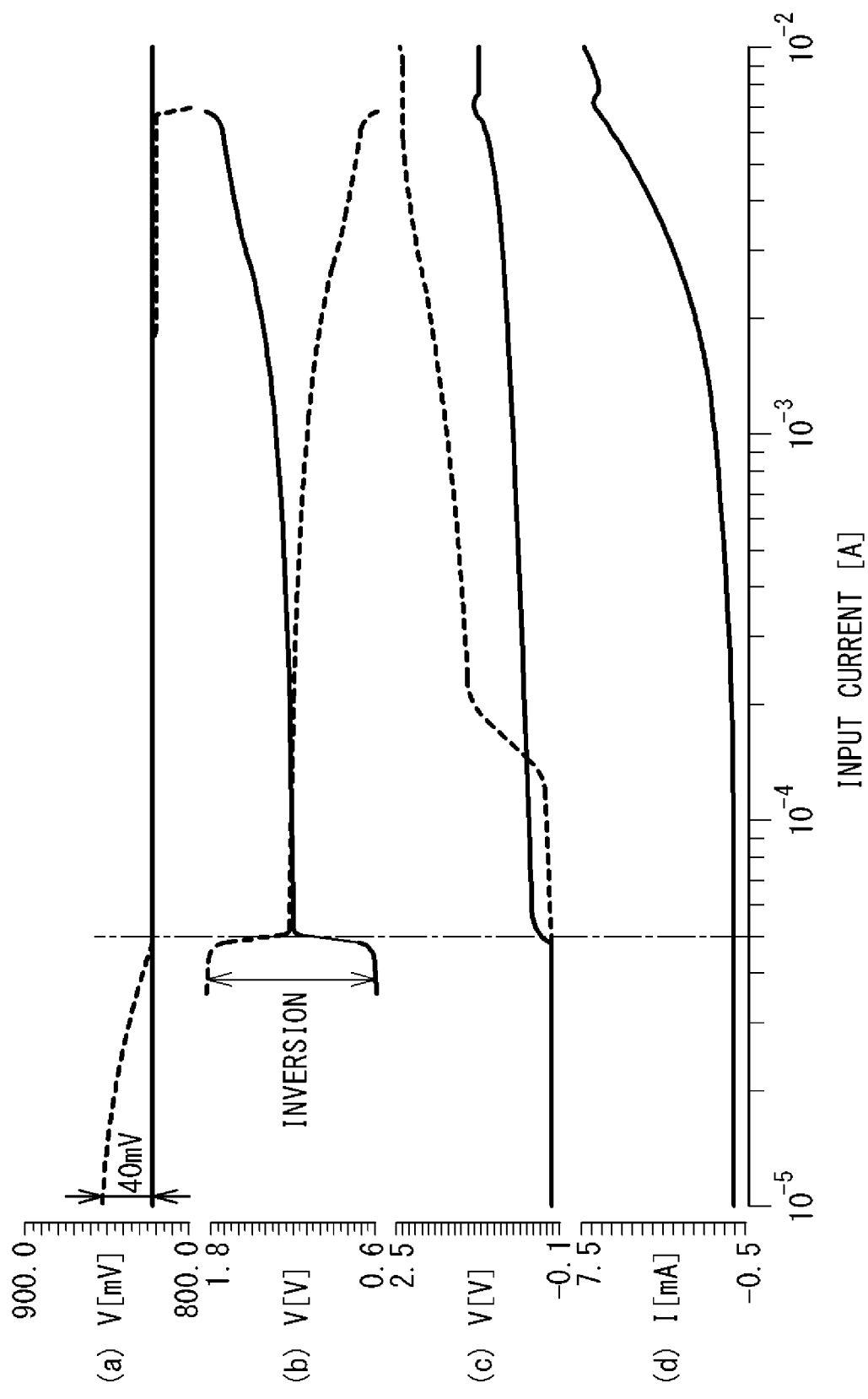
FIG. 4 shows graphs showing an example of integrator output inversion in open loop operation, as a result of DC analysis (static characteristic analysis).

FIG. 4 shows graphs showing an example of integrator output inversion in open loop operation, as a result of DC analysis (static characteristic analysis). (a) shows the voltage (broken line) outputted by the amplifier 13 and a reference voltage (solid line) to which a negative offset voltage (40 mV) is added. (b) shows the positive phase potential (solid line) and the negative phase potential (broken line) of the output of the integrator 161. (c) shows the gate potential (broken line) of the MOS transistor M3 of the alternating-current adjustment circuit 15 and the gate potential (solid line) of the MOS transistor M0, M1 of the direct-current adjustment circuit 14. (d) shows the DC offset current to be removed. The horizontal axis represents a logarithmic scale for the input current (Iin) used in common for (a) to (d).

In a current range (from $10^{-5}$ [A] up to the one-dot chain line in the vertical direction in FIG. 4) where the input current is low, the direct-current adjustment circuit 14 and the alternating-current adjustment circuit 15 do not function due to the effect of the negative offset voltage, and extracting (hereinafter, extracting a current will be referred to as "current extracting") of AC and DC currents from the input current is not performed. With respect to the input current not less than the one-dot chain line, the direct-current adjustment circuit 14 and the alternating-current adjustment circuit 15 perform the current extracting. Here, as is apparent from the graph (b), it is a problem that, when the input current is less than the one-dot chain line, the positive phase potential and the negative phase potential of the output of the integrator 161 are inverted to a great extent.

Figure 5:
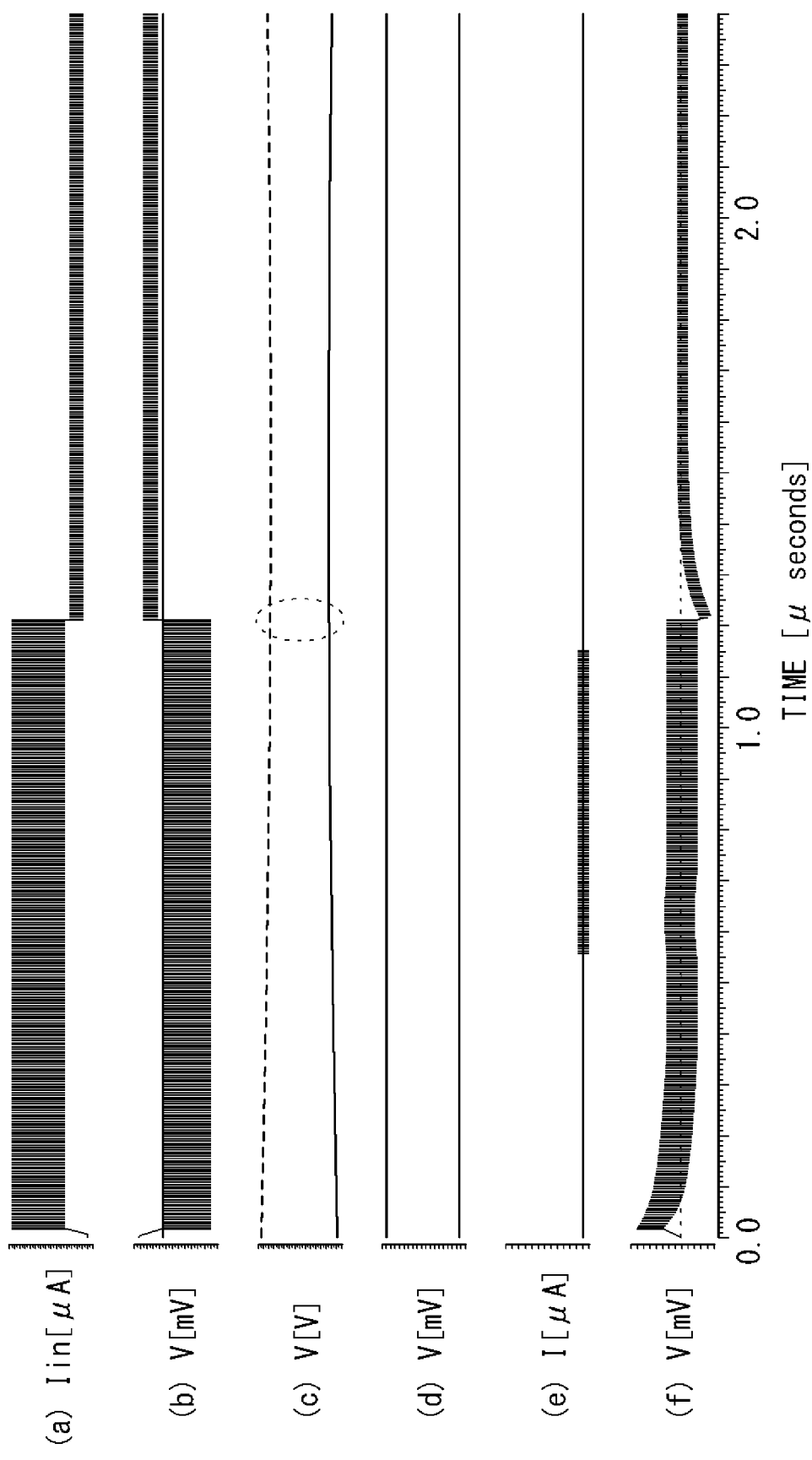
FIG. 5 shows graphs showing an example of delay in transient response due to integrator output inversion, as a result of transience analysis.

Next, FIG. 5 shows graphs showing an example of delay of transient response due to integrator output inversion, as a result of transience analysis. In FIG. 5, (a) shows the input current (Iin) from the avalanche photodiode 12 at the time when an optical signal in which a strong input burst is followed by a weak input burst has been received. (b) shows an inverted amplification output (waveform in a burst state) of the amplifier 13 with respect to the input voltage, and −40 mV (linear portion) as a reference voltage. (c) shows the positive phase potential (solid line) and the negative phase potential (broken line) of the output of the integrator 161. In (d), the upper line represents the source voltage of the MOS transistor M3 for AC current extracting, and two lower lines overlapping each other represent the gate voltage of the MOS transistor M3 for AC current extracting, and the gate voltage of the MOS transistor M0, M1 for DC current extracting. The lower lines are at the level of GND. (e) shows two lines substantially overlapping each other for the entire time. The line having a slight up-down vibration represents the DC extracted current, and the linear line represents the AC extracted current. (f) shows the input voltage to the subsequent stage circuit 21. The horizontal axis represents time that is common for (a) to (f).

When (c) in FIG. 5 is focused on, an inversion state is established for the entire time, and as indicated by the elliptic dotted line, the burst ends while the inversion state with respect to the strong input burst is not eliminated. Therefore, the optical reception device 10 is in a state where the loop is open all the time. When (d) is focused on, the lower lines are at the GND level and current extracting is not performed. Also, when (e) is focused on, current extracting is not substantially performed. FIG. 5 reveals that, when the output of the integrator 161 is inverted, the inversion cannot be eliminated, whereby delay in transient response may be caused.

In a case where a negative offset voltage is not provided to the reference voltage, and in a case of a PVT (Process-Voltage-Temperature) condition where a positive offset voltage increases even in a small degree, even a weak input burst may cause a closed loop, thereby causing current extracting, resulting in increase in noise. Therefore, reducing the negative offset voltage is not a good measure, and a sufficient negative offset voltage is preferably provided. In addition, a function that prevents, even when a sufficient negative offset voltage is provided, increase in the inverted potential difference between the positive phase potential and the negative phase potential of the output of the integrator 161 is necessary. The inversion suppression circuit 162 is a solution to this necessity.

Case Where Inversion Suppression Circuit is Provided

Figure 6:
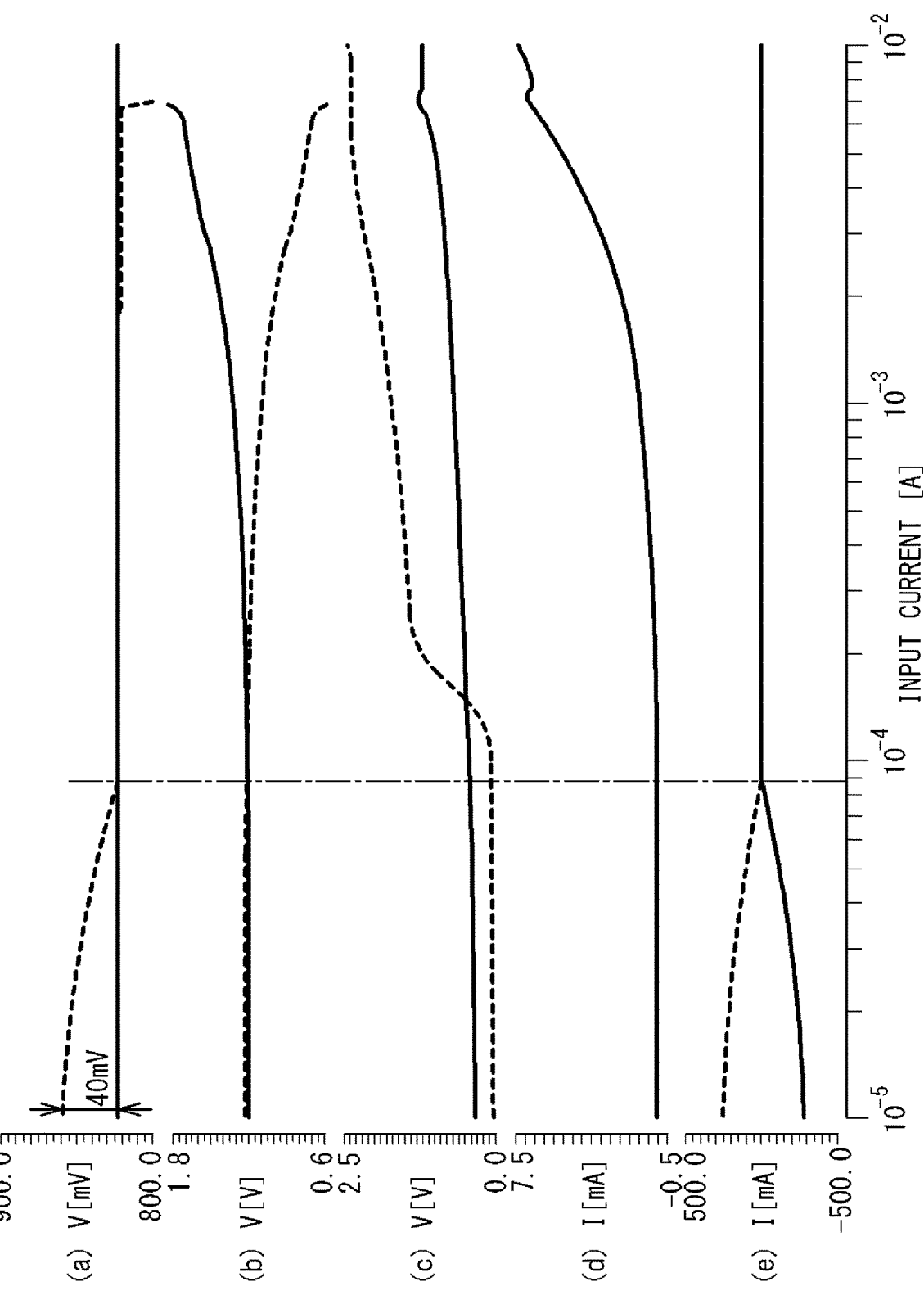
FIG. 6 shows graphs showing an example of integrator output inversion in open loop operation, as a result of DC analysis (static characteristic analysis).

FIG. 6 shows graphs showing an example of integrator output inversion in open loop operation, as a result of DC analysis (static characteristic analysis). (a) shows the voltage (broken line) outputted by the amplifier 13 and a reference voltage (solid line) to which a negative offset voltage (40 mV) is added. (b) shows the positive phase potential (solid line) and the negative phase potential (broken line) of the output of the integrator 161. (c) shows the gate potential (broken line) of the MOS transistor M3 of the alternating-current adjustment circuit 15 and the gate potential (solid line) of the MOS transistor M0, M1 of the direct-current adjustment circuit 14. (d) shows the DC offset current to be removed. (e) shows the current (solid line) to be injected to the positive phase, and the current (broken line which is merged with the solid line at a point) to be extracted from the negative phase, for suppression of inversion of the output of the integrator 161. The horizontal axis represents a logarithmic scale for the input current (Iin) used in common for (a) to (e). The vertical one-dot chain line in FIG. 6 shows the position of the input current at about 90 μA.

As shown in (e) of FIG. 6, in a weak input range from an input current of 10 μA ($10^{-5}$ A) to 90 μA, a current is injected to the positive phase and a current equivalent thereto is extracted from the negative phase. As a result, as is apparent from the waveform of (b), even when a negative offset voltage is provided, large inversion of the output of the integrator 161 in the weak input range is suppressed.

Figure 7:
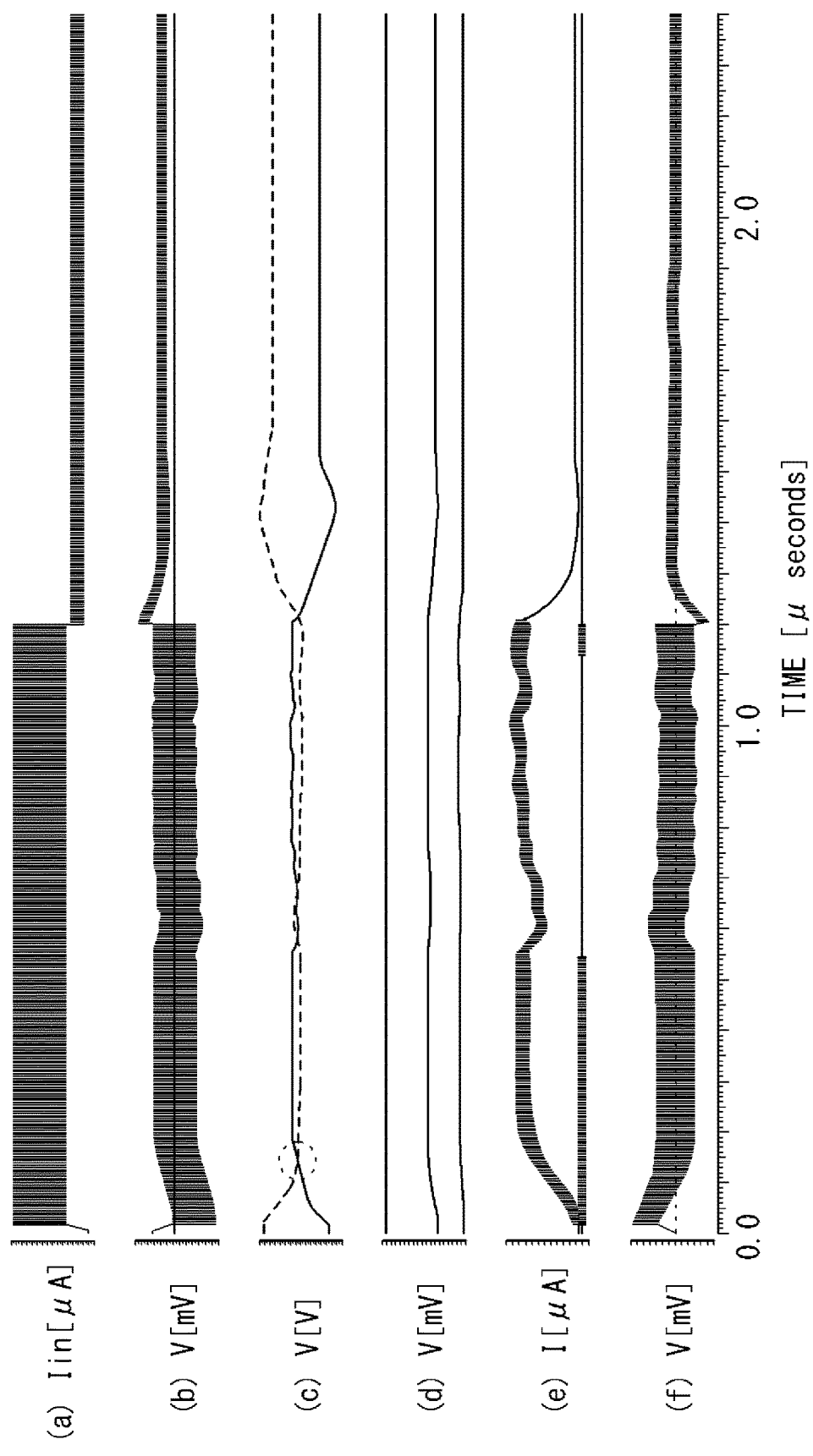
FIG. 7 shows graphs showing an example of a result of transience analysis.

FIG. 7 shows graphs showing an example of a result of transience analysis. In FIG. 7, (a) shows the input current (Iin) from the avalanche photodiode 12 at the time when an optical signal in which a strong input burst is followed by a weak input burst has been received. (b) shows an inverted amplification output (waveform in a burst state) of the amplifier 13 with respect to the input voltage, and −40 mV (linear portion) as a reference voltage. (c) shows the positive phase potential (solid line) and the negative phase potential (broken line) of the output of the integrator 161. In (d), the upper line represents the source voltage of the MOS transistor M3 for AC current extracting, the middle line represents the gate voltage of the MOS transistor M0, M1 for DC current extracting, and the lower line represents the gate voltage of the MOS transistor M3 for AC current extracting. In (e), the upper line having a large variation represents the DC extracted current, and the lower linear line represents the AC extracted current. (f) shows the input voltage to the subsequent stage circuit 21. The horizontal axis represents time that is common for (a) to (f).

When (c) in FIG. 7 is focused on, the inversion state is eliminated within about 0.2 μseconds (=200 n seconds), in a circular mark indicated by a dotted line, from the head of the first burst. When compared with FIG. 5 in which the inversion state cannot be eliminated before the end of the burst, it is clear that delay in transient response is dramatically improved and reduced.

Thereafter, although an inversion state of the output of the integrator occurs with respect to the weak input burst, the gate voltage of the MOS transistor M0, M1 of the direct-current adjustment circuit 14 is maintained, and the closed loop is maintained. In (e), the DC extracted current is reduced with respect to the weak input burst and is converged to several μA, but the closed loop is maintained.

Figure 8:
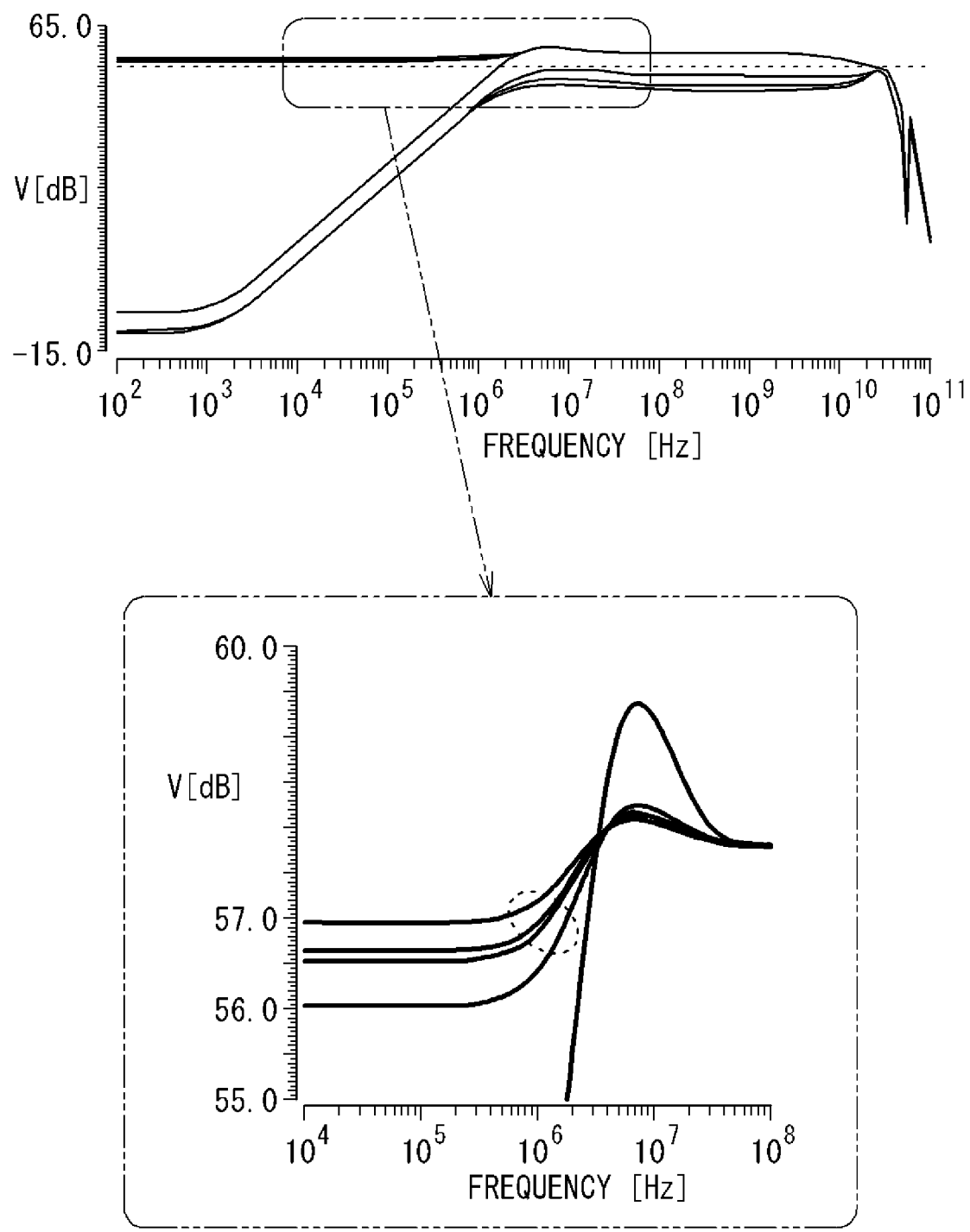
FIG. 8 shows an example of a graph showing what frequency characteristics an amplification factor of an amplifier exhibits with respect to input currents having various magnitudes, after an inversion suppression circuit has been added.

FIG. 8 is an example of a graph showing what frequency characteristics the amplification factor of the amplifier 13 exhibits with respect to input currents having various magnitudes, after the inversion suppression circuit 162 has been added. The lower graph is an enlarged view of the portion surrounded by the two-dot chain line in the upper graph. The portion surrounded by the elliptic dotted line in the lower graph shows that feedback is performed (a closed loop is established) even in the case of a weak input burst of less than 50 μA.

Further, as for noise characteristics, with respect to an input current (Iin) of 24 μA as an integrated value for a 25 GHz band, the effective value of noise was 1.71 μA rms when a completely closed loop operation was performed without addition of a negative offset voltage. When a negative offset voltage is added without provision of the inversion suppression circuit 162, 1.52 μA rms is realized, and noise is reduced.

In contrast, when the inversion suppression circuit 162 was provided, the effective value of noise with respect to a similar input current was 1.54 μA. Therefore, even when the inversion suppression circuit 162 is provided, the increase is only 0.02 μA rms, and noise is sufficiently reduced relative to the case where the completely closed loop operation was performed. This is considered to be due to an influence of the fact that, when the inversion suppression circuit 162 is used and a closed loop is realized, the DC extracted current is as small as several μA.

As described above, through provision of the inversion suppression circuit 162, delay in transient response can be reduced, and in addition, under a condition that a reference voltage to which a negative offset voltage is added is lower than the output voltage of the amplifier 13, a closed loop can be maintained without increase of noise.

Others

The optical reception device 10 of the disclosure above is provided to the optical line terminal 1, but may be provided to the optical network units 2, 3, 4.

Supplementary Note

The above embodiment is merely illustrative in all aspects and should not be recognized as being restrictive. The scope of the present disclosure is defined by the scope of the claims, and is intended to include meaning equivalent to the scope of the claims and all modifications within the scope.

REFERENCE SIGNS LIST 1 optical line terminal
1a line card
2, 3, 4 optical network unit
5 optical fiber
6 optical coupler
7, 8, 9 optical fiber
10 optical reception device
11 preamplifier
12 avalanche photodiode
13 amplifier
14 direct-current adjustment circuit
15 alternating-current adjustment circuit
16 controller
17 differential circuit
18 detection circuit
19 reference potential generation circuit
20 capacitor
21 subsequent stage circuit
100 PON system
161 integrator
162 inversion suppression circuit
162A operational transconductance amplifier (OTA)
162B, 162C current mirror circuit 163 operational transconductance amplifier (OTA)
164 current controller
L input electric path
M0, M1, M2, M3 MOS transistor
M11, M12, M13, M14, M15 MOS transistor
N negative phase
P positive phase

The invention claimed is:

1. An optical reception device configured to receive an optical signal in a burst state, the optical reception device comprising:
   a light receiving element configured to receive the optical signal;
   an amplifier configured to receive and amplify a current based on an input current from the light receiving element;
   a direct-current adjustment circuit connected to an input electric path extending from the light receiving element to the amplifier, the direct-current adjustment circuit being configured to remove an offset current included in the input current;
   an alternating-current adjustment circuit connected to the input electric path and configured to cause a part of the input current to flow therein; and
   a controller configured to control the direct-current adjustment circuit and the alternating-current adjustment circuit on the basis of an output of the amplifier and a reference voltage, wherein
   the controller includes
      an integrator configured to integrate the output of the amplifier and output a resultant output to two electric paths of a positive phase and a negative phase, and
      an inversion suppression circuit configured to operate so as to inject a current to the positive phase and extract a current from the negative phase when a negative phase potential of the output of the integrator is higher than a positive phase potential thereof.

2. The optical reception device according to claim 1, wherein
   the current injected by the inversion suppression circuit and the current extracted by the inversion suppression circuit are equivalent to each other.

3. The optical reception device according to claim 1, wherein
   the inversion suppression circuit includes:
      an operational transconductance amplifier configured to convert, into a current, a voltage outputted by the integrator and based on a potential difference between the positive phase and the negative phase, the operational transconductance amplifier being configured to output the current; and
      a current mirror circuit configured to generate a current to be injected to the positive phase and a current to be extracted from the negative phase, on the basis of an output of the operational transconductance amplifier.

4. The optical reception device according to claim 1, wherein
   a negative offset voltage is added to the reference voltage.

5. The optical reception device according to claim 1, wherein
   when the positive phase potential is higher than the negative phase potential, the inversion suppression circuit does not perform an operation of injecting a current to the positive phase and extracting a current from the negative phase.

6. The optical reception device according to claim 2, wherein
   the inversion suppression circuit includes:
      an operational transconductance amplifier configured to convert, into a current, a voltage outputted by the integrator and based on a potential difference between the positive phase and the negative phase, the operational transconductance amplifier being configured to output the current; and
      a current mirror circuit configured to generate a current to be injected to the positive phase and a current to be extracted from the negative phase, on the basis of an output of the operational transconductance amplifier.

7. The optical reception device according to claim 2, wherein
   a negative offset voltage is added to the reference voltage.

8. The optical reception device according to claim 3, wherein
   a negative offset voltage is added to the reference voltage.

9. The optical reception device according to claim 6, wherein
   a negative offset voltage is added to the reference voltage.

10. The optical reception device according to claim 2, wherein
   when the positive phase potential is higher than the negative phase potential, the inversion suppression circuit does not perform an operation of injecting a current to the positive phase and extracting a current from the negative phase.

11. The optical reception device according to claim 3, wherein
   when the positive phase potential is higher than the negative phase potential, the inversion suppression circuit does not perform an operation of injecting a current to the positive phase and extracting a current from the negative phase.

12. The optical reception device according to claim 4, wherein
   when the positive phase potential is higher than the negative phase potential, the inversion suppression circuit does not perform an operation of injecting a current to the positive phase and extracting a current from the negative phase.

13. The optical reception device according to claim 6, wherein
   when the positive phase potential is higher than the negative phase potential, the inversion suppression circuit does not perform an operation of injecting a current to the positive phase and extracting a current from the negative phase.

14. The optical reception device according to claim 7, wherein
   when the positive phase potential is higher than the negative phase potential, the inversion suppression circuit does not perform an operation of injecting a current to the positive phase and extracting a current from the negative phase.

15. The optical reception device according to claim 8, wherein
   when the positive phase potential is higher than the negative phase potential, the inversion suppression circuit does not perform an operation of injecting a current to the positive phase and extracting a current from the negative phase.

16. The optical reception device according to claim 9, wherein when the positive phase potential is higher than the negative phase potential, the inversion suppression circuit does not perform an operation of injecting a current to the positive phase and extracting a current from the negative phase.

17. An optical line terminal connected to a plurality of optical network units via an optical transmission line formed by an optical fiber, the optical line terminal comprising:
a light receiving element configured to receive an optical signal in a burst state from each optical network unit;
an amplifier configured to receive and amplify a current based on an input current from the light receiving element;
a direct-current adjustment circuit connected to an input electric path extending from the light receiving element to the amplifier, the direct-current adjustment circuit being configured to remove an offset current included in the input current;
an alternating-current adjustment circuit connected to the input electric path and configured to cause a part of the input current to flow therein; and
a controller configured to control the direct-current adjustment circuit and the alternating-current adjustment circuit on the basis of an output of the amplifier and a reference voltage, wherein
the controller includes
an integrator configured to integrate the output of the amplifier and output a resultant output to two electric paths of a positive phase and a negative phase, and
an inversion suppression circuit configured to operate so as to inject a current to the positive phase and extract a current from the negative phase when a negative phase potential of the output of the integrator is higher than a positive phase potential thereof.

18. A PON system comprising:
a plurality of optical network units;
an optical transmission line formed by an optical fiber; and
an optical line terminal configured to communicate with the plurality of optical network units via the optical transmission line, wherein
an optical reception device installed at least to the optical line terminal among the optical network units and the optical line terminal includes
a light receiving element configured to receive an optical signal in a burst state from each optical network unit,
an amplifier configured to receive and amplify a current based on an input current from the light receiving element,
a direct-current adjustment circuit connected to an input electric path extending from the light receiving element to the amplifier, the direct-current adjustment circuit being configured to remove an offset current included in the input current,
an alternating-current adjustment circuit connected to the input electric path and configured to cause a part of the input current to flow therein, and
a controller configured to control the direct-current adjustment circuit and the alternating-current adjustment circuit on the basis of an output of the amplifier and a reference voltage, and
the controller includes
an integrator configured to integrate the output of the amplifier and output a resultant output to two electric paths of a positive phase and a negative phase, and
an inversion suppression circuit configured to operate so as to inject a current to the positive phase and extract a current from the negative phase when a negative phase potential of the output of the integrator is higher than a positive phase potential thereof.

19. A preamplifier comprising:
an amplifier configured to receive and amplify a current based on an input current from a light receiving element configured to receive an optical signal in a burst state;
a direct-current adjustment circuit connected to an input electric path extending from the light receiving element to the amplifier, the direct-current adjustment circuit being configured to remove an offset current included in the input current;
an alternating-current adjustment circuit connected to the input electric path and configured to cause a part of the input current to flow therein; and
a controller configured to control the direct-current adjustment circuit and the alternating-current adjustment circuit on the basis of an output of the amplifier and a reference voltage, wherein
the controller includes
an integrator configured to integrate the output of the amplifier and output a resultant output to two electric paths of a positive phase and a negative phase, and
an inversion suppression circuit configured to operate so as to inject a current to the positive phase and extract a current from the negative phase when a negative phase potential of the output of the integrator is higher than a positive phase potential thereof.

20. An optical reception method for receiving an optical signal in a burst state, the optical reception method comprising, in a stage of preamplification:
receiving and amplifying, by an amplifier, a current based on an input current from a light receiving element configured to receive the optical signal;
removing an offset current included in the input current and releasing a part of the input current, on the basis of an output of the amplifier and a reference voltage; and
integrating, by an integrator, the output of the amplifier and outputting a resultant output to two electric paths of a positive phase and a negative phase, and when a negative phase potential of the output to the two electric paths is higher than a positive phase potential thereof, injecting a current to the positive phase and extracting a current from the negative phase.

21. A method for suppressing inversion of an output of an integrator in a preamplifier for optical reception, the method comprising:
receiving and amplifying a current based on an input current from a light receiving element configured to receive an optical signal in a burst state;
removing an offset current included in the input current and releasing a part of the input current, on the basis of an output obtained through amplification and a reference voltage; and
integrating, by the integrator, the output and outputting a resultant output to two electric paths of a positive phase and a negative phase, and when a negative phase potential of the output to the two electric paths is higher than a positive phase potential thereof, injecting a current to the positive phase and extracting a current from the negative phase.

* * * * *